(12) United States Patent
Iwata et al.

(10) Patent No.: US 7,711,012 B2
(45) Date of Patent: May 4, 2010

(54) SEMICONDUCTOR DEVICE

(75) Inventors: Hiroshi Iwata, Nara (JP); Tomohisa Okuno, Tenri (JP); Akihide Shibata, Nara (JP); Seizo Kakimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1127 days.

(21) Appl. No.: 10/467,808

(22) PCT Filed: Feb. 13, 2002

(86) PCT No.: PCT/JP02/01184

§ 371 (c)(1),
(2), (4) Date: Aug. 12, 2003

(87) PCT Pub. No.: WO02/065550

PCT Pub. Date: Aug. 22, 2002

(65) Prior Publication Data

US 2004/0065901 A1 Apr. 8, 2004

(30) Foreign Application Priority Data

Feb. 16, 2001 (JP) ............................. 2001-040013

(51) Int. Cl.
*H04J 99/00* (2009.01)

(52) U.S. Cl. .................. 370/546; 370/429; 365/185.11; 365/189.05; 365/189.011; 365/189.16; 365/230.03; 711/156; 714/10; 714/11; 714/12; 714/13

(58) Field of Classification Search ................. 370/429, 370/546; 365/185.11, 189.05, 230.03; 711/156; 714/10–13
See application file for complete search history.

(56) References Cited

U.S. PATENT DOCUMENTS 5,535,419 A * 7/1996 O'Brien ....................... 710/36

(Continued)

FOREIGN PATENT DOCUMENTS

EP     0 541 288 A2     5/1993

(Continued)

*Primary Examiner*—William Trost, IV
*Assistant Examiner*—Toan D Nguyen
(74) *Attorney, Agent, or Firm*—Birch, Stewart, Kolasch & Birch, LLP

(57) ABSTRACT

The yield of a semiconductor device is improved which has a large-scale logic circuit or which has both a logic circuit and a memory. A basic circuit block is provided with an input/output circuit. A transmission line and a branch line connect the input/output circuits so that information can be exchanged through the input/output circuits between one basic circuit block and another basic circuit block. The memory in each basic circuit block or in each input/output circuit can be programmed from the outside to designate the destination of a signal. By thus changing the program in the memory, the transmission destination of a signal can be changed to give various functions efficiently with a limited circuit scale. Moreover, if a basic circuit block fails another basic circuit block substitutes for it to improve the yield drastically.

8 Claims, 7 Drawing Sheets

U.S. PATENT DOCUMENTS

| | | | |
|---|---|---|---|
| 5,590,297 A * | 12/1996 | Huck et al. | 711/1 |
| 6,260,101 B1 * | 7/2001 | Hansen et al. | 711/5 |
| 6,343,366 B1 * | 1/2002 | Okitaka | 714/733 |
| 6,445,615 B2 * | 9/2002 | Kobayashi et al. | 365/185.11 |
| 6,496,610 B2 * | 12/2002 | Yamagishi et al. | 382/305 |
| 6,550,020 B1 * | 4/2003 | Floyd et al. | 714/10 |
| 7,012,738 B1 * | 3/2006 | Schwarte | 359/325 |

FOREIGN PATENT DOCUMENTS

| | | |
|---|---|---|
| JP | 61-020348 A | 1/1986 |
| JP | 61-265831 A | 11/1986 |
| JP | 63-183684 A | 7/1988 |
| JP | 64-028937 A | 1/1989 |
| JP | 6-274459 | 9/1994 |
| JP | 2000-148716 A | 5/2000 |

* cited by examiner

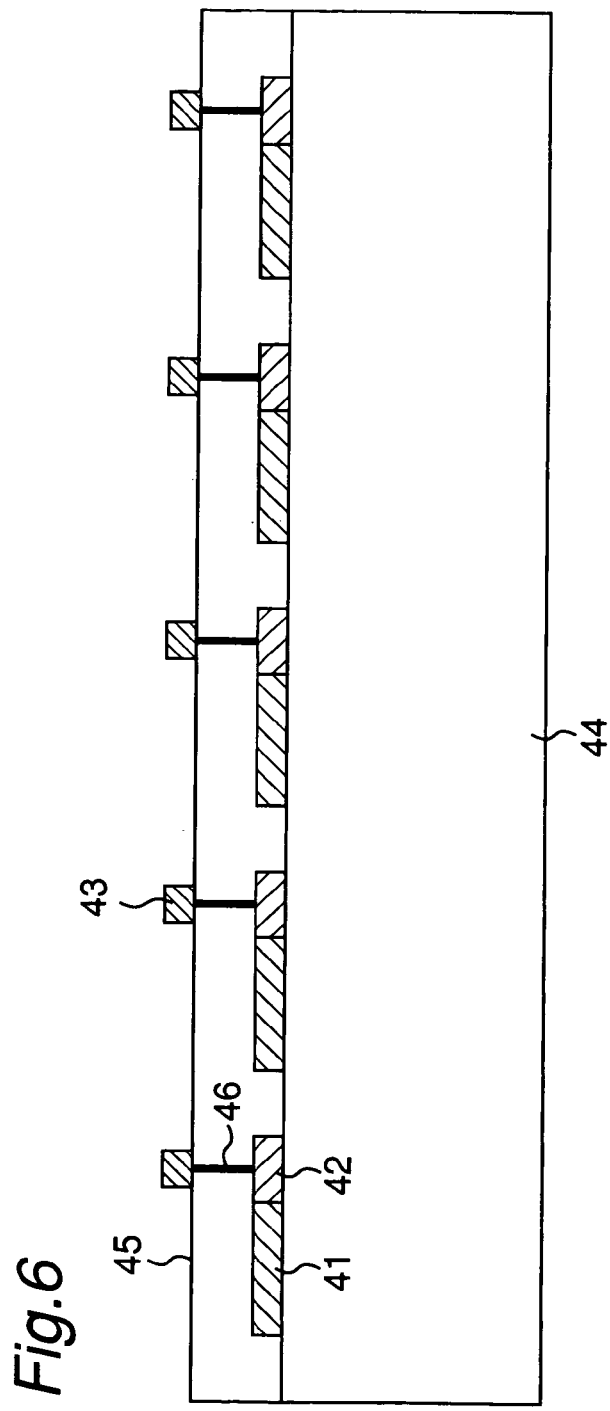

SEMICONDUCTOR DEVICE

This application is the national phase under 35 U.S.C. § 371 of PCT International Application No. PCT/JP02/01184 which has an International filing date of Feb. 13, 2002, which designated the United States of America.

TECHNICAL FIELD

The present invention relates to a semiconductor device, and in particular, to a semiconductor integrated circuit that executes communications between a plurality of basic circuit blocks, which are formed on one substrate and provided with input/output circuits.

BACKGROUND ART

LSI's (large-scale integrated circuits) have drastically improved integration with improvements in fine processing techniques. With the improved integration, the scales of the logic circuits mounted on LSI's have become significantly increased and made to have high functions. Moreover, by virtue of the system-on-chip technology by which the logic circuits of a microprocessor, an ASIC (application specific integrated circuit) and so on and various memory circuits are mounted together on one semiconductor substrate, various electronic apparatuses have been further developed in terms of high functions and downsizing.

In a conventional LSI, the role of each circuit is fixed. That is, each basic circuit executes only a specified basic operation, and advanced functions are attained by combining a number of these basic circuits. Moreover, the communication channels of information between the basic circuits are determined in the design stage and connections are provided by fixed interconnections.

FIG. 7A shows a signal flow in a conventional LSI. The signal is determined to flow sequentially from A→B→C→D with regard to the circuit blocks A through D as the aforementioned basic circuits, and the roles of the circuit blocks A through D are fixed.

However, since the signal is determined to flow sequentially from A→B→C→D and the roles of the circuit blocks A through D are fixed in the above-mentioned conventional LSI as shown in FIG. 7A, there are the following problems.

That is, if a part of the circuit (for example, the circuit block B) fails as shown in FIG. 7B, then the signal is not transmitted to the circuit blocks subsequent to the circuit block B, and the functions of the whole circuit mounted on the LSI are to be lost. Accordingly, there is a problem that the entire LSI becomes defective even when only one basic circuit (circuit block) fails, and if the logic circuit has a large scale or mounted together with different kinds of elements, the yield of LSI's is reduced.

Moreover, according to the conventional LSI technologies, if, for example, a signal is transmitted parallel from the circuit block A to all of the circuit blocks B, C and D in FIG. 7A, it is required to connect the circuit block A to each of the circuit blocks B, C and D by mutually independent interconnections. There is also a problem that, if the interconnections are miniaturized and complicated, then the parasitic capacitances between the interconnections increase, reducing the operating speed.

Therefore, the object of the present invention is to provide a semiconductor device with a good yield even when the device has a large scale or comprises the logic circuits, memories and so on mounted together.

SUMMARY OF THE INVENTION

In order to achieve the above object, there is provided a semiconductor device comprising:
a plurality of basic circuit blocks which are formed on an identical semiconductor substrate and constructed of a logic circuit or a memory circuit or a circuit of a combination of a logic circuit and a memory circuit;
input/output circuits which are formed on the semiconductor substrate and provided for the plurality of basic circuit blocks and execute transmission and reception of information between the corresponding basic circuit block and another basic circuit block;
transmission means which are connected to each of the input/output circuits and transmit a signal representing the information from the input/output circuit to another input/output circuit; and
transmission destination information storage means which is provided for either one of the basic circuit block and the input/output circuit and in which transmission destination information of the information are written or erased from outside.

According to the above-mentioned construction, the basic circuit blocks provided with the input/output circuits are formed on one semiconductor substrate. The transmission destination information is written from the outside into one destination information storage means of either one of the basic circuit block and the input/output circuit, and the signal that represents the information from the basic circuit block is transmitted via the transmission means to another basic circuit block corresponding to the transmission destination information by the input/output circuit. Therefore, by properly setting from the outside the transmission destination of the information from the basic circuit block according to the purpose, an optimum logic circuit is constructed according to the contents of the job to be processed.

Furthermore, by changing the transmission destination of the information from the outside, the functions of the entire logic circuit mounted on the semiconductor substrate can be changed, and various functions can be efficiently possessed with a limited circuit scale. Furthermore, by changing the transmission destination of the information, it is possible to put the defective basic circuit block into a dormant state and make another basic circuit block substitute for it. Therefore, even if there are some defects in the basic circuit blocks mounted on the semiconductor substrate, it is possible to prevent the entire logic circuit from becoming defective and drastically improve the yield of the semiconductor devices.

It is to be noted that the term of the input/output circuit mentioned herein has a concept including circuits divided into an output circuit and an input circuit.

In one embodiment of the present invention, the semiconductor device further comprises self-identification information storage means which is provided for either one of the basic circuit block and the input/output circuit and in which self-identification information for identifying oneself are written or erased from outside.

According to this embodiment, for example, when the defective basic circuit block is put into the dormant state and the auxiliary basic circuit block is made to substitute for it, it is proper to merely copy the contents of the transmission destination information storage means and the self-identification information storage means in the defective basic circuit block into the auxiliary basic circuit block and thereafter erase the contents of both the information storage means of the defective basic circuit block. Accordingly, there is no need to rewrite the contents of the transmission destination information storage means in the transmission origin basic circuit block or to preparatorily set the self-identification information of all the auxiliary basic circuit blocks, and the transmission route of the information is easily changed.

In one embodiment of the present invention, at least three of the input/output circuits share the transmission means, and the input/output circuits which share the transmission means execute transmission and reception of the information by a communication method according to a multiplex transmission system.

According to this embodiment, the transmission of the information between the basic circuit blocks that share the transmission means is executed without interference by controlling the input/output circuits that share the transmission means. Therefore, if the shared transmission means is a metal interconnection or an optical waveguide, then the interconnection can be drastically simplified. The parasitic capacitance between the interconnections is thus reduced, and a reduction in the operating speed due to the parasitic capacitance is alleviated.

In one embodiment of the present invention, the transmission means are optical waveguides, and the transmitted signal is a modulated optical signal.

According to this embodiment, the modulated optical signal is transmitted via the optical waveguide, and therefore, communications at a speed higher than the transmission of a digital signal via a metal interconnection become possible, and the problem of the parasitic capacitance is avoided. It is to be noted that the term of optical includes the concept of infrared rays and ultraviolet rays.

In one embodiment of the present invention, the transmission means are antennas, and the transmitted signal is a modulated electromagnetic wave signal.

According to this embodiment, the modulated electromagnetic wave signal is transmitted by the antenna, and therefore, the problem of the parasitic capacitance occurring in the case of digital signal transmission via the metal interconnection is avoided. Moreover, if electromagnetic waves of a short wavelength are used, high-speed communications become possible. Therefore, the transmission speed between the basic circuit blocks is increased, and the operating speed of the logic circuit constructed on the semiconductor substrate can be increased.

In one embodiment of the present invention, the input/output circuits execute transmission and reception of the information by a communication method according to time-division multiple access, an identification code of the destination basic circuit block is written as the transmission destination information into the transmission destination information storage means, and an identification code of the self basic circuit block is written as the self-identification information into the self-identification information storage means.

According to this embodiment, multiplex transmission communications can be achieved by the input/output circuit with a comparatively small circuit scale. Moreover, changing the functions of the entire logic circuit mounted on the semiconductor substrate and stopping the defective basic circuit block and assigning its function to another basic circuit block are efficiently executed on the basis of the identification code.

In one embodiment of the present invention, the input/output circuits execute transmission and reception of the information by a communication method according to a code-division multiple access system, a spreading code of a destination basic circuit block is written as the transmission destination information into the transmission destination information storage means, and a spreading code of the self basic circuit block is written as the self-identification information into the self-identification information storage means.

According to this embodiment, multiplex transmission communications of high anti-noise capability become possible. Moreover, changing the functions of the entire logic circuit mounted on the semiconductor substrate and stopping the defective basic circuit block and assigning its function to another basic circuit block are efficiently executed on the basis of the spreading code.

BRIEF DESCRIPTION OF THE DRAWINGS

FIG. 6 is a sectional view of a semiconductor device different from those of FIGS. 1, 2, 4 and 5.

DESCRIPTION OF THE INVENTION

Figure 1:
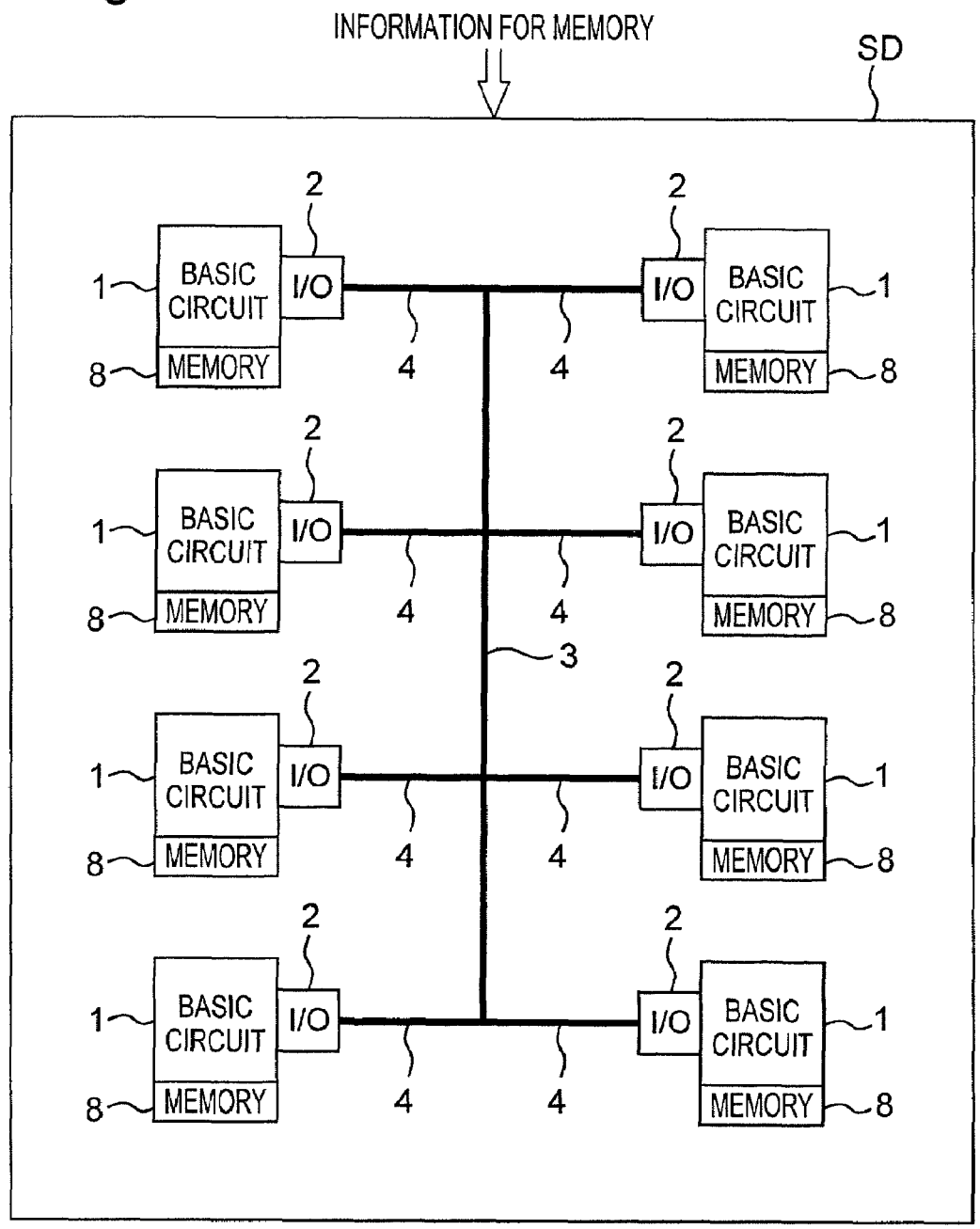
FIG. 1 is a block diagram of a semiconductor device of this invention.

This invention will be described in detail below on the basis of the embodiments thereof shown in the drawings.

FIRST EMBODIMENT

FIG. 1 is a block diagram of the semiconductor device SD of the present embodiment. In the figure, there are basic circuit blocks 1, and each of the basic circuit blocks 1 is constructed of a logic circuit, a memory circuit or a circuit in which a logic circuit, a memory circuit and so on are mounted together. It is to be noted that the basic circuit blocks 1 may have same circuit construction or different circuit constructions.

Figure 2:
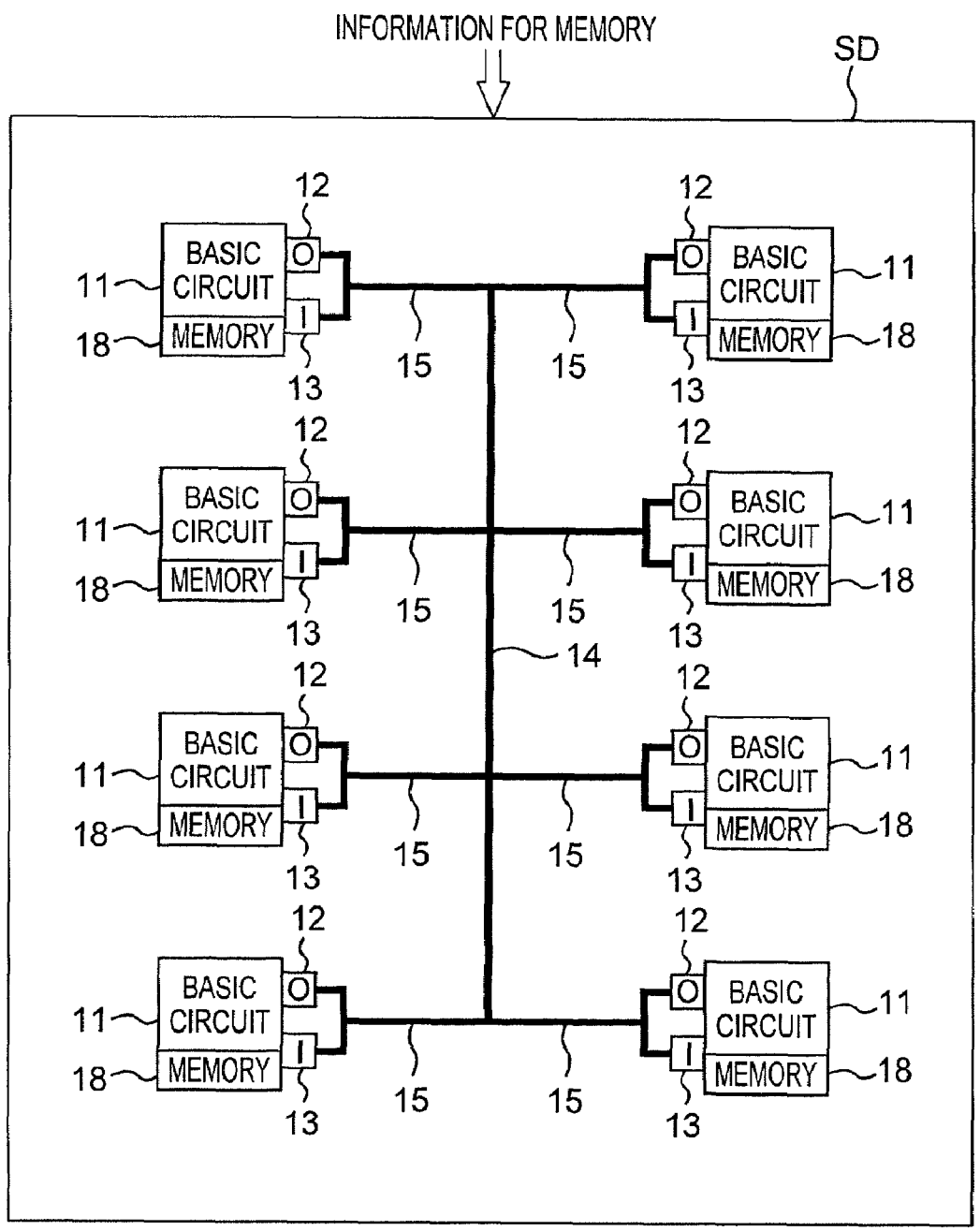
FIG. 2 is a block diagram of a semiconductor device different from that of FIG. 1.

An input/output circuit 2 is provided for each of the basic circuit blocks 1, and the input/output circuits 2 are connected by a common transmission line 3 and branch lines 4. Then, each of the basic circuit blocks 1 is able to exchange information with other basic circuit blocks 1 via the input/output circuits 2. In FIG. 1, information output to the other basic circuit blocks 1 and information input from the other basic circuit blocks 1 are executed by the input/output circuits 2. As shown in FIG. 2, it is acceptable to provide an output circuit 12 and an input circuit 13 for each of basic circuit blocks 11 and execute information output to the other basic circuit blocks 11 via a transmission line 14 and branch lines 15 and information input from the other basic circuits blocks 11 via the transmission line 14 and the branch lines 15 separately by the output circuit 12 and the input circuit 13.

The transmission lines 3, 14 and the branch lines 4 and 15 may be provided by metal interconnections or optical waveguides. When the transmission lines 3, 14 and the branch lines 4 and 15 are provided by optical waveguides and information transmission between the input/output circuits 2 or information transmission between the output circuits 12 and the input circuits 13 is optically executed, it is possible to execute communications at a speed higher than electrical communications. Furthermore, there is an advantage that the parasitic capacitance, which poses a problem in the case of metal interconnections, does not occur.

As a system of communications between the basic circuit blocks 1 and 11 executed by the input/output circuits 2 or the output circuits 12 and the input circuits 13, there is, for example, a TDMA system. The TDMA system is a system in which the basic circuit blocks 1 and 11 are divided on the time basis and all the basic circuits blocks 1 and 11 execute communications using same frequency. When this system is used, it is required to provide one basic circuit block 1 or 11 that plays the role of managing the entire system. However, the input/output circuits 2 or the output circuits 12 and the input circuits 13 can be constructed comparatively compact.

Moreover, as a system of communications between the basic circuit blocks 1 and 11, a CDMA system is also acceptable. The CDMA system is to assign spreading codes to the basic circuit blocks 1 and 11 and convert a signal into a wideband modulation signal through spread modulation by the spreading code. Then, on the reception side, the received wideband modulation signal is despread by using the spreading code used during transmission, obtaining the original signal. That is, the basic circuit block 1 or 11 on the transmission side is able to transmit a signal to a specified basic circuit block 1 or 11 if the signal is subjected to spread modulation by using the spreading code for reception of the basic circuit block 1 or 11 on the reception side. If this CDMA system is used, the anti-noise capability can be improved.

As a system of communications between the basic circuit blocks 1 and 11, it is also acceptable to otherwise use an FDMA (Frequency Division Multiple Access) system, a PSK (Phase Shift Keying) system, an FSK (Frequency Shift Keying) system, an ASK (Amplitude Shift Keying) system or the like.

If the transmission lines 3 and 14 and the branch lines 4 and 15 are metal interconnections, then a digital signal or a modulated digital signal or a modulated RF (Radio Frequency) signal is transmitted. Moreover, if the transmission lines 3 and 14 and the branch lines 4 and 15 are optical waveguides, then modulated light (including infrared rays and ultraviolet rays) is transmitted.

The signal transmission destination of the basic circuit block 1 or 11 via the input/output circuit 2 or the output circuit 12 is variable. In the above case, as a method for making the signal transmission destination variable, there is a method for providing, for example, a memory 8, 18 in each of the basic circuit blocks 1 and 11 or each of the input/output circuits 2 or each of the output circuits 12 and programming the signal transmission destination into this memory from the outside of semiconductor device SD.

Figure 3A:
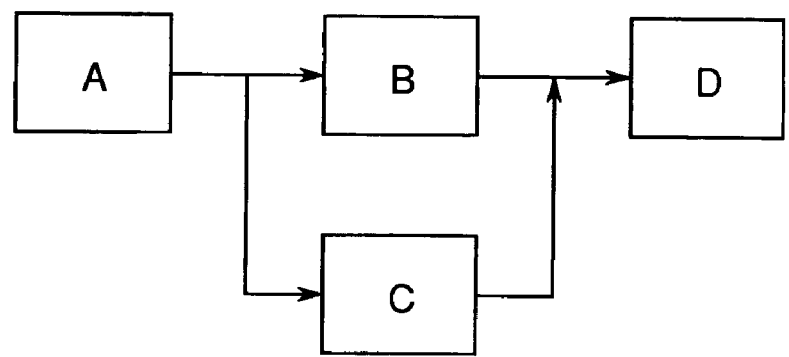
FIGS. 3A and 3B are views showing a signal flow when the transmission destination of the signal from each basic circuit block is made variable.
Figure 3B:
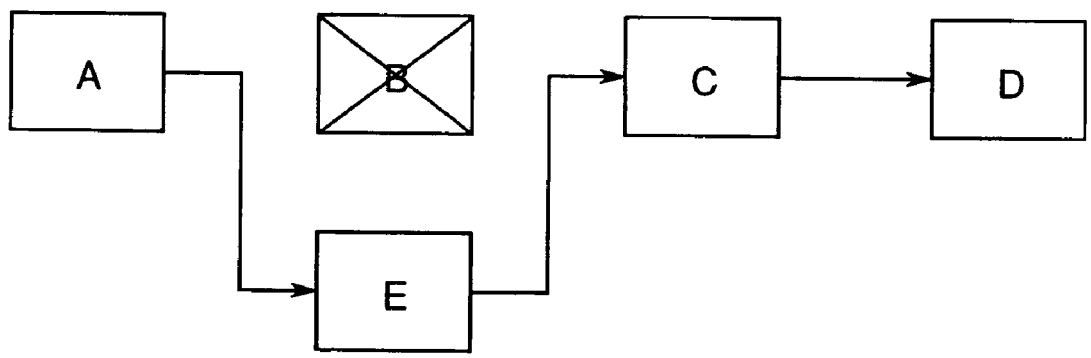

FIGS. 3A and 3B schematically show a signal flow when the transmission destination of the basic circuit block 1 or 11 is made variable. For example, by executing programming of basic circuit blocks B and C as the transmission destination into the memory units of a basic circuit block A from the outside and executing programming of a basic circuit block D into the memory units of the basic circuit blocks B and C, the signal from the basic circuit block A can be inputted parallel to the basic circuit blocks B and C as shown in FIG. 3A. As described above, by properly setting the information transmission destination according to the purpose from the outside, an optimum logic circuit can be constructed according to the contents of a job to be processed. Moreover, the functions of the entire circuit can be changed by the programming into the memory units, and a variety of functions can be provided with a limited circuit scale.

Figure 7A:
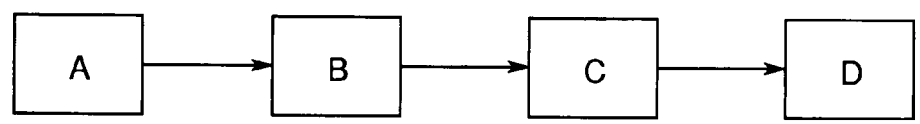
FIGS. 7A and 7B are views showing a signal flow between circuit blocks of a conventional LSI.

In contrast to this, in the case of the conventional LSI as shown in FIG. 7A, the roles of the circuit blocks A through D are fixed and the signal flow is also fixed. Therefore, the functions of the entire circuit are fixed, and it is required to change the circuit design every time the functions are changed. For the above reasons, there is caused the case where the circuit scale is increased in comparison with the semiconductor device of the present embodiment.

Furthermore, in FIGS. 3A and 3B, by rewriting the signal transmission destination programmed in the memory of the basic circuit block A from the basic circuit block B to a basic circuit block E that has the same function as basic circuit block B and programming the memory of the basic circuit block E such that its signal transmission destination is the basic circuit block C, it becomes possible to use the basic circuit block E in place of the basic circuit block B as shown in FIG. 3B. That is, if a basic circuit block fails, it is possible to make another basic circuit block substitute for it. By so doing, the yield can be drastically improved.

Figure 7B:
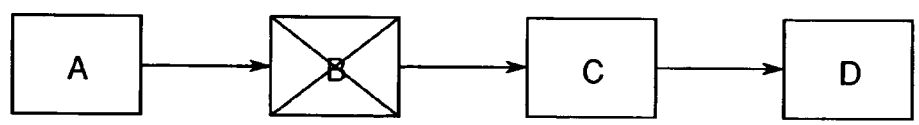

In contrast to this, in the case of the conventional LSI as shown in FIG. 7A, the roles of the circuit blocks A through D are fixed and the signal flow is also fixed. Therefore, as shown in FIG. 7B, the entire circuit becomes defective when only one circuit block B fails, and this leads to a factor of reducing the yield.

In general, if the yield of each divided circuit is P when a certain circuit is divided by n, then the yield of the certain circuit as a whole becomes $P^n$. For example, assuming that there is a circuit divided into ten basic circuit blocks and the yield of each of the basic circuit blocks is 90%, then the yield of this entire circuit becomes about 35%. In contrast to this, assuming that, for example, eleven basic circuit blocks, each of which has a yield of 90%, are produced and a circuit is required to be constructed by selecting ten out of them, then the yield of this circuit becomes as follows. That is, assuming that the yield of each basic circuit block is P (=90%) the probability that the eleven basic circuit blocks are all normal is $P^{11}$, and the probability that ten basic circuit blocks are normal and one basic circuit block is defective is $_{11}C_1 P^{10}(1-P)^1$. Therefore, when eleven basic circuit blocks are produced, the probability that ten or more out of them are normal is $P^{11} + {}_{11}C_1 P^{10}(1-P)^1$. As a result, the yield of this circuit becomes about 70%, and the yield can be drastically improved in comparison with the case where the circuit comprises ten basic circuit blocks.

Moreover, if it is attempted to provide interconnections as shown in FIG. 1 between eight circuit blocks in the conventional LSI, it is required to connect one circuit block to each of the other seven circuit blocks by mutually independent transmission lines, and the interconnections between the circuit blocks become very complicated. However, according to the semiconductor device of the present embodiment, if the multiplex transmission system (TDMA system, CDMA system or FDMA system) is used as a communication system between the input/output circuits 2 or between the output circuits 12 and the input circuits 13, then signals from all the basic circuits block 1 and 11 can be transmitted without interruption via one transmission line by controlling the input/output circuits 2 or the output circuits 12. Therefore, the branch lines 4 and 15 extended from the input/output circuits 2 or the output circuits 12 and the transmission lines 3 and 14 connected to them are only required to be at least one. Therefore, the interconnections can be drastically simplified.

It is to be noted that the branch lines extended from the input/output circuits 2 or the output circuits 12 and the transmission lines are not all required to be one, and it is acceptable to provide a plurality of lines at need. In the above case, it is possible to increase the effective transmission speed between the input/output circuits 2 or between the output circuits 12 and the input circuits 13. Moreover, as described above, the conventional LSI has a problem that the operating speed is reduced due to an increase in the parasitic capacitance between the interconnections in accordance with the miniaturization and complication of the interconnections. However, in the semiconductor device of the present embodiment, the above-mentioned problem can be alleviated by the simplification of the interconnections.

When the TDMA system is used as a communication system between the basic circuit blocks 1 and 11, identification codes of the basic circuit blocks 1 and 11 or the input/output circuits 2 or the output circuits 12 are made rewritable from the outside. Moreover, all the identification codes assigned to all the basic circuits block 1 and 11 are stored in the basic circuit blocks 1 and 11 that play the role of managing the entire system, and therefore, these codes are made rewritable from the outside. With this arrangement, it becomes easy to change the role of each of the basic circuit blocks 1 and 11 and give no role (put the block into the dormant state). That is, it becomes easy to efficiently change the functions of the entire circuit by programming or maintain the functions of the entire circuit by putting the defective basic circuit block into the dormant state and assigning its function to another basic circuit block.

Moreover, when the CDMA system is used as a communication system between the basic circuit blocks 1 and 11, a spreading code for transmission and a spreading code for reception in the basic circuit blocks 1 and 11 or the input/output circuits 2 or the output circuits 12 are made rewritable from the outside. With this arrangement, it becomes easy to change the role of each of the basic circuit blocks 1 and 11 and give no role (put the block into the dormant state). That is, it is easy to efficiently change the functions of the entire circuit by programming or maintain the functions of the entire circuit by putting the defective basic circuit block into the dormant state and assigning the functions to another basic circuit block.

As described above, in the semiconductor device of the present embodiment, the input/output circuit 2 or the output circuit 12 and the input circuit 13 are provided for each of the basic circuit blocks 1 and 11 constructed of a logic circuit, a memory circuit or a circuit in which a logic circuit and a memory circuit are mounted together. Moreover, the input/output circuits 2 or the output circuits 12 and the input circuits 13 are connected by the common transmission lines 3 and 14 and the branch lines 4 and 15. Then, the basic circuit blocks 1 and 11 exchange information with other basic circuits block 1 and 11 via the input/output circuits 2 or the output circuits 12. In the above case, by making the memory units of the basic circuit blocks 1 and 11 or the input/output circuits 2 or the output circuits 12 externally programmable with regard to the signal transmission destination and changing this program, the signal transmission destination is made variable.

Therefore, an optimum logic circuit can be constructed according to the contents of the job to be processed. Moreover, the functions of the entire circuit can be changed by the programming into the memory, and therefore, a variety of functions can be efficiently provided with a limited circuit scale. Furthermore, it is possible to make another basic circuit block substitute for a certain basic circuit block that is failing by rewriting the signal transmission destination programmed in the memory, and the cost can be reduced with drastically improved yield.

As described above, it is acceptable to make the self-identification information for identifying the self basic circuit block (own identification code in the case of the TDMA system or own spreading code for reception in the case of the CDMA system) externally programmable instead of making the signal transmission destination externally programmable into the memory. The memory in the above case is required to be provided in each of the basic circuit blocks 1 and 11 or each of the input/output circuits 2 or each of the output circuits 12. In the above case, by copying the self-identification information of the basic circuit block that has become defective into the memory of an auxiliary basic circuit block and thereafter erasing the self-identification information of the basic circuit block that has become defective, the auxiliary basic circuit block can play the role of substituting for the basic circuit block that has become defective.

In the above case, there is no need to rewrite the transmission destination of the originating basic circuit block that has transmitted the signal to the basic circuit block that has become defective or to preparatorily assign the self-identification information of all the auxiliary basic circuit blocks. Therefore, the signal transmission route can easily be changed.

In the above case, if the information exchange with the other basic circuits blocks 1 and 11 is executed by the multiplex transmission system of the TDMA system, the CDMA system or the FDMA system, then the signals from all the basic circuits blocks 1 and 11 can be transmitted via one transmission line without interruption by controlling the input/output circuits 2 or the output circuits 12. Therefore, the transmission lines 3 and 14 and the branch lines 4 and 15 between the input/output circuits 2 or the output circuits 12 and the input circuits 13 are only required to be at least one, and the interconnections can be drastically simplified. As a result, the reduction in the operating speed can be restrained by alleviating an increase in the parasitic capacitance between the interconnections caused by the miniaturization and complication of the interconnections.

Moreover, by constructing the transmission lines 3 and 14 and the branch lines 4 and 15 of optical waveguides, the signal can be transmitted by modulated light including infrared rays and ultraviolet rays. Therefore, communications at a speed higher than electrical communications become possible, and the parasitic capacitance that poses a problem in the case of metal interconnections can be prevented from occurring.

Figure 4:
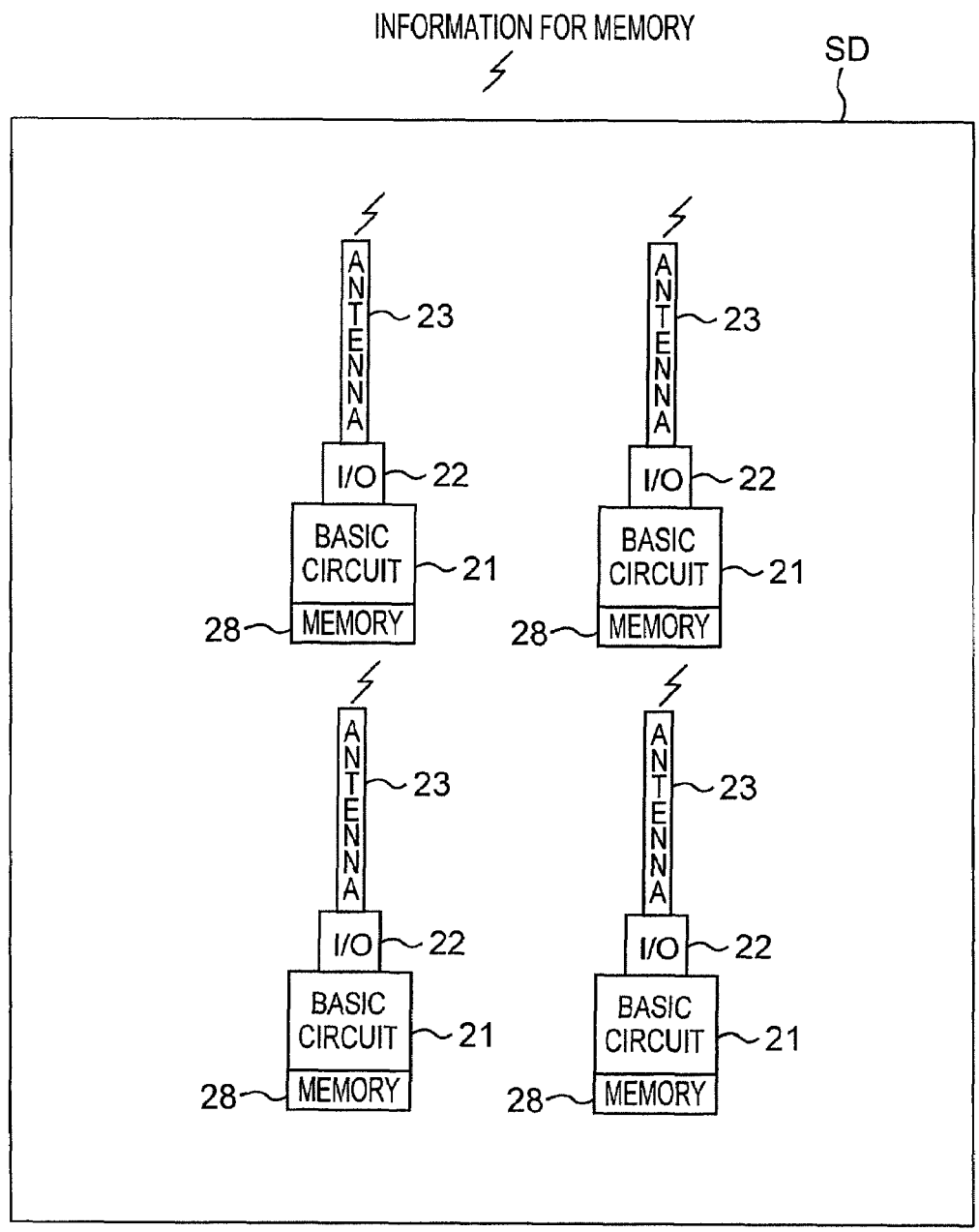
FIG. 4 is a block diagram of a semiconductor device different from those of FIGS. 1 and 2.

In the aforementioned embodiment, the information exchange between the basic circuit blocks 1 and 11 is executed via the transmission lines 3 and 14 and the branch lines 4 and 15, which provide connections between the input/output circuits 2 or between the output circuits 12 and the input circuits 13. However, as shown in FIG. 4, it is also acceptable to remove the above-mentioned transmission lines and execute the information exchange between basic circuit blocks 21 by modulated electromagnetic waves via input/output circuits 22 and antennas 23. In this case, there is an advantage that communications between the basic circuit blocks 21 can be executed with no interconnection and the parasitic capacitance that poses a problem when the transmission lines 3 and 14 and the branch lines 4 and 15 are constructed of metal interconnections does not occur. The signal transmission destination is programmed into memory 28 from the outside of semiconductor device SD.

SECOND EMBODIMENT

Figure 5:
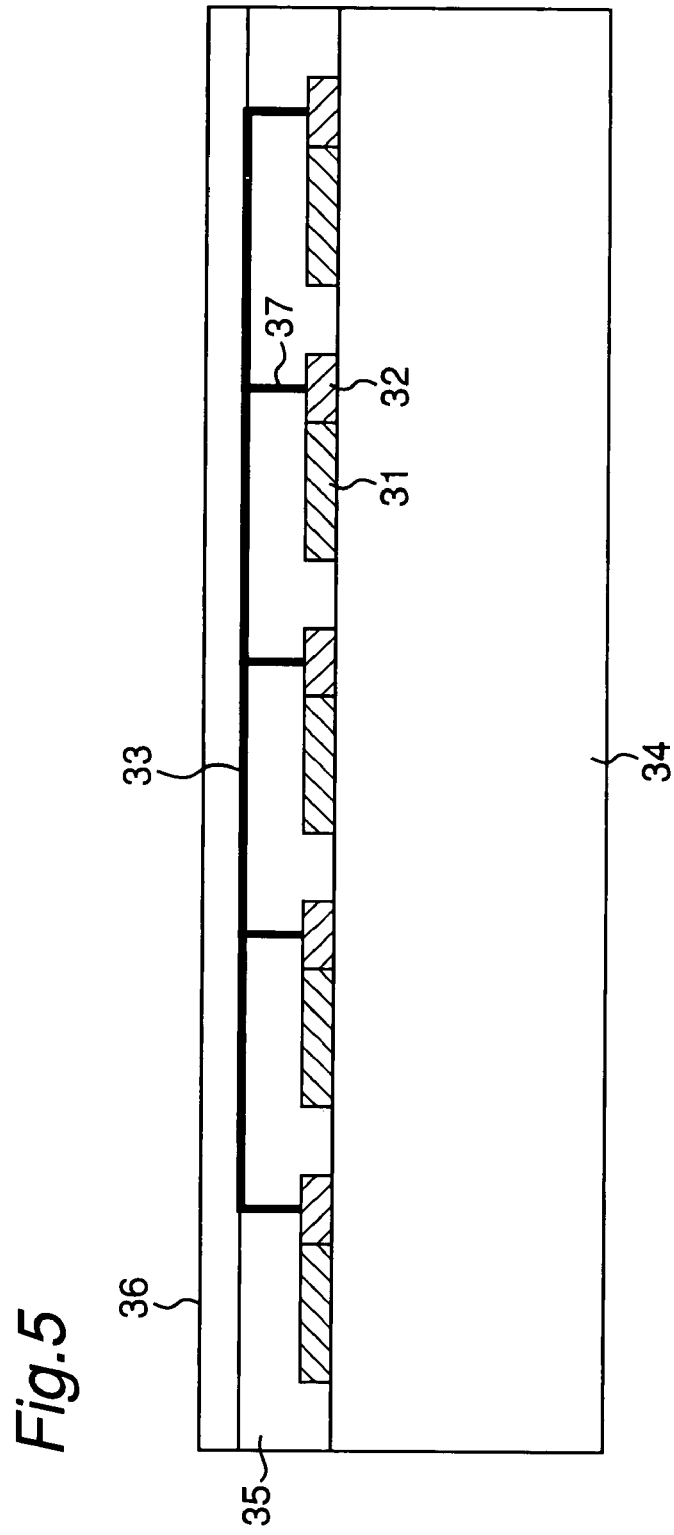
FIG. 5 is a sectional view of a semiconductor device different from those of FIGS. 1, 2 and 4.

FIG. 5 is a sectional view of the semiconductor device of the present embodiment. The semiconductor device of the present embodiment is obtained by forming the semiconductor device of the first embodiment on one semiconductor substrate. The semiconductor device of the present embodiment will be described below with reference to FIG. 5.

Basic circuit blocks 31 and input/output circuits 32 are formed on a semiconductor substrate 34. The basic circuit blocks 31 are connected via the input/output circuits 32 to a transmission line 33 formed on a layer of insulation film 35 by branch lines 37, and the whole body is covered with a protective film 36. In this case, the basic circuit blocks 31, the input/output circuits 32, the transmission line 33 and the branch lines 37 have the same constructions as those of the basic circuit blocks 1, the input/output circuits 2, the transmission line 3 and the branch lines 4 of the first embodiment. It is to be noted that the basic circuit blocks 31 and the input/output circuits 32 are assumed to include local interconnections.

The transmission line 33 connected to the input/output circuits 32 is separated from the basic circuit blocks 31 and the input/output circuits 32 by the layer insulation film 35 and formed as an upper layer metal interconnection. The transmission line 33 is connected to the input/output circuits 32 by the branch lines 37 through contact holes opened at the layer insulation film 35.

According to the semiconductor device of the present embodiment, as described above in connection with the first embodiment, a variety of functions can be provided by the circuits with a limited scale, and the cost can be reduced by drastically improving the yield. Moreover, by drastically simplifying the interconnections, the parasitic capacitance between the interconnections can be reduced to allow high-speed operation to be achieved. Moreover, the semiconductor device of the present embodiment has an advantage that it can be formed by using the conventional LSI processing technique.

THIRD EMBODIMENT

FIG. 6 is a sectional view of the semiconductor device of the present embodiment. The semiconductor device of the present embodiment differs from the semiconductor device of the second embodiment in that communications between the basic circuit blocks are executed by electromagnetic waves. The semiconductor device of the present embodiment will be described below with reference to FIG. 6.

Basic circuit blocks 41 and input/output circuits 42 are formed on a semiconductor substrate 44. The entire surface of the semiconductor substrate 44 is covered with a protective film 45. In this case, the basic circuit blocks 41 and the input/output circuits 42 have the same constructions as those of the basic circuit blocks 1 and the input/output circuits 2 of the first embodiment. It is to be noted that the basic circuit blocks 41 and the input/output circuits 42 are assumed to include local interconnections.

Antennas 43 are formed in positions corresponding to the input/output circuits 42 on the protective film 45, and the antennas 43 and the input/output circuits 42 are connected together by interconnections via contact holes 46 formed at the protective film 45. Electromagnetic waves modulated by a signal from a basic circuit block 41 are transmitted from the antenna 43 to another basic circuit block 41 by the input/output circuit 42. Moreover, the electromagnetic waves from another basic circuits block 41 are received by this antenna 43.

According to the semiconductor device of the present embodiment, as described above in connection with the first embodiment, a variety of functions can be provided by the circuits with a limited scale, and the cost can be reduced by drastically improving the yield. Moreover, due to the use of electromagnetic waves for communications, the parasitic capacitance that poses a problem in the case of metal interconnections does not occur, and high-speed operation can be achieved. Moreover, if electromagnetic waves of a short wavelength are used, then high-speed communications are easily achieved. Therefore, the transmission speed between the basic circuit blocks 41 can be increased, and high-speed operation can be achieved.

When the electromagnetic waves used has a short wavelength as in the case of infrared rays, light or the like, it is proper to provide connections between the input/output circuits 42 by optical waveguides similarly to the case of the second embodiment.

The aforementioned second embodiment and the third embodiment are described on the basis of the input/output circuits 32 and 42 provided for the respective basic circuit blocks 31 and 41. However, this invention is not limited to this, and it is also acceptable to individually provide the output circuits and the input circuits.

INDUSTRIAL APPLICABILITY

This invention is used for a semiconductor integrated circuit that executes communications between a plurality of basic circuit blocks formed on one substrate.

The invention claimed is:

1. A semiconductor device on a single semiconductor substrate comprising:
a plurality of basic circuit blocks formed on the single semiconductor substrate with each basic circuit block constructed of a combination of a logic circuit and a memory circuit, a part of the plurality of basic circuit blocks being configured to perform a certain function that is the same for one another and a p art of the plurality of basic circuit blocks being configured to perform a certain function that is different from one another, with a function that is more advanced than that of the certain function performed by any one basic circuit block being performed by combining a number of the basic circuit blocks together;
a plurality of input/output circuits formed on the single semiconductor substrate and provided for the plurality of basic circuit blocks, said input/output circuits executing transmission and reception of information between the corresponding basic circuit block and another basic circuit block;
transmission means connected to each of the input/output circuits and transmitting a signal representing information from one of the input/output circuits to another of the input/output circuits; and
transmission destination information storage means provided for either one of the basic circuit block and the input/output circuit of each basic circuit block, wherein transmission destination information is written to or erased from each transmission destination information storage means from outside the semiconductor device,
the transmission destination information is a basic circuit block destination of the information that is to be transmitted from any first basic circuit block on the single semiconductor substrate to any second basic circuit block on the single semiconductor substrate, using the input/output circuit provided corresponding to each basic circuit block, in order to perform the function that is more advanced than that of the certain function performed by any one basic circuit block, and by changing the transmission destination information to be written to the transmission destination information storage means, make the second basic circuit block into a dormant state, while making another basic circuit block performing the same function as that of the second basic circuit block active, so that the semiconductor device is prevented from being stopped due to a defective basic circuit block, or making another basic circuit block performing a different function from that of the second basic circuit block active, so that the function of the semiconductor device is diversified and the yield of the semiconductor device is improved.

2. The semiconductor device as claimed in claim 1, further comprising:

self-identification information storage means provided for either one of the basic circuit block and the input/output circuit and in which self-identification information for identifying oneself are written or erased from outside.

3. The semiconductor device as claimed in claim 1, wherein at least three of the input/output circuits share the transmission means, and the input/output circuits which share the transmission means execute transmission and reception of the information by a communication method according to a multiplex transmission system.

4. The semiconductor device as claimed in claim 1, wherein the transmission means being metal interconnections, and the transmitted signal being at least a digital signal, a modulated digital signal or a modulated high-frequency signal.

5. The semiconductor device as claimed in claim 1, wherein the transmission means being optical waveguides, and the transmitted signal being a modulated optical signal.

6. The semiconductor device as claimed in claim 1, wherein the transmission means being antennas, and the transmitted signal being a modulated electromagnetic wave signal.

7. The semiconductor device as claimed in claim 2, wherein the input/output circuits execute transmission and reception of the information by a communication method according to time-division multiple access, an identification code of the destination basic circuit block being written as the transmission destination information into the transmission destination information storage means, and an identification code of a self-identification basic circuit block being written as the self-identification information into the self-identification information storage means.

8. The semiconductor device as claimed in claim 2, wherein the input/output circuits execute transmission and reception of the information by a communication method according to a code-division multiple access system, a spreading code of a destination basic circuit block being written as the transmission destination information into the transmission destination information storage means, and a spreading code of a self-identification basic circuit block being written as the self-identification information into the self-identification information storage means.

* * * * *